United States Patent
An

[19]

[11] Patent Number: 6,127,959
[45] Date of Patent: Oct. 3, 2000

[54] FLASH ANALOG-TO-DIGITAL CONVERTER WITH REDUCED NUMBER OF RESISTORS AND COMPARATORS

[75] Inventor: Byoung-kwon An, Kunpo, Rep. of Korea

[73] Assignee: Samsung Electronics Co., Ltd, Rep. of Korea

[21] Appl. No.: 09/224,828

[22] Filed: Jan. 4, 1999

[30] Foreign Application Priority Data

May 29, 1998 [KR] Rep. of Korea ....................... 98-19804

[51] Int. Cl.[7] ....................................... H03M 1/12
[52] U.S. Cl. ........................................ 341/156; 341/154
[58] Field of Search ..................... 341/155, 156, 341/154, 161, 160

[56] References Cited

U.S. PATENT DOCUMENTS

| | | | |
|---|---|---|---|
| 4,849,759 | 7/1989 | Hughes | 341/156 |
| 5,623,265 | 4/1997 | Pawar et al. | 341/160 |
| 5,821,893 | 10/1998 | Kumamoto et al. | 341/161 |
| 6,011,503 | 1/2000 | Lee | 341/159 |

*Primary Examiner*—Peguy JeanPierre
*Attorney, Agent, or Firm*—Samuels, Gauthier & Stevens LLP

[57] ABSTRACT

A flash analog-to-digital converter reduces a property mismatching problem which may occur due to process variations by reducing the number of comparators and resistors as compared to conventional converters. A half code generator receives an analog signal and outputs a one-bit middle code and a (m/2–1)-bit half thermometer code in response to a system clock signal, where $m=2^n$ and n is a positive integer. A code generator receives the middle code and the (m/2–1)-bit half thermometer code, performs a logic operation with respect to the middle code and the half thermometer code, and outputs an operation result as a (m–1)-bit full thermometer code. An encoder encodes the (m–1)-bit full thermometer code into n-bit binary data.

10 Claims, 3 Drawing Sheets

FLASH ANALOG-TO-DIGITAL CONVERTER WITH REDUCED NUMBER OF RESISTORS AND COMPARATORS

BACKGROUND OF THE INVENTION

1. Field of the Invention

The present invention relates to an analog-to-digital converter, and more particularly, to a flash analog-to-digital converter.

2. Description of the Related Art

A conventional n-bit one-channel flash analog-to-digital converter is comprised of $2^n$ (here, n is a positive integer) resisters and $(2^n-1)$ comparators. In such a flash analog-to-digital converter including many comparators and resisters, in order to achieve linearity of the converter, it is important to make the properties of the comparators and resistors consistent with one another.

However, due to process variations, a property mismatching problem may occur so that the properties of the comparators or the resistors are different from one another. When the property mismatching problem exists, linearity of the analog-to-digital converter is degraded, and malfunction or erroneous conversion may occur. Thus, it is generally difficult to employ the flash analog-to-digital converter for an application which requires analog signal conversion to high precision such as 6 bits or more.

Meanwhile, with a recent trend toward multichannel signal processing, a number of analog-to-digital converters, corresponding to the number of channels, are simultaneously used. However, when many flash analog-to-digital converters are simultaneously used, the property mismatching between the analog-to-digital converters of different channels may also occur.

SUMMARY OF THE INVENTION

To solve the above and other problems, one object of the present invention is to provide a flash analog-to-digital converter which minimizes a property mismatching problem which may occur due to process variations by reducing the number of comparators and resistors to half of the conventional converter.

In one aspect of a flash analog-to-digital converter according to the present invention, an n-bit flash analog-to-digital converter converts an analog signal of a single channel into n-bit digital data. A half code generator receives an analog signal and outputs a one-bit middle code and a (m/2−1)-bit half thermometer code in response to a system clock signal, where $m=2^n$ and n is a positive integer. A code generator receives the middle code and the (m/2−1)-bit half thermometer code, performs logic operation with respect to the middle code and the half thermometer code, and outputs an operation result as a (m−1)-bit full thermometer code. An encoder encodes the (m−1)-bit full thermometer code into an n-bit binary data.

In another aspect of the present invention, an n-bit flash analog-to-digital converter converts analog signals of a plurality of channels into n-bit digital data. A half thermometer code generator receives first through p-th analog signals via first through p-th input terminals, respectively, and outputs a one-bit middle code and a (m/2−1)-bit half thermometer code for each of the first through p-th analog signals, where $m=2^n$, n is a positive integer and p is an integer greater than 1, in response to a system clock signal. Each of first through p-th channel code generators receives the middle code and the (m/2−1)-bit half thermometer code, performs logic operation with respect to the middle code and the half thermometer code, and outputs an operation result as a (m−1)-bit full thermometer code. An encoder encodes the (m−1)-bit full thermometer code into n-bit binary data. Each of first through p-th channel encoders encodes the (m−1)-bit full thermometer code output by respective one of the first through p-th channel code generators into n-bit binary data.

In general, a conventional n-bit analog-to-digital converter requires $(2^n-1)$ comparators, and data output by the $(2^n-1)$ comparators is a $(2^n-1)$ bit full thermometer code. Here, the full thermometer code is comprised of a $(2^{n-1}-1)$ bit upper half thermometer code, a $(2^{n-1}-1)$ bit lower half thermometer code, and a middle code. The characteristics of such a thermometer code will be described herein.

For example, it is assumed that an analog signal is input to a positive input terminal of a middle $((2^{n-1})$th) comparator for outputting a middle code value, and that a reference voltage smaller than the analog signal input to the positive input is input to a negative input terminal. The middle comparator outputs a "high" logic level signal. Here, $(2^{n-1}-1)$ comparators, which receive a reference voltage lower than the reference voltage of the middle comparator and output a lower half thermometer code value, all output a "high" logic level code value. Also, when the analog signal input to the positive input of the middle comparator is smaller than the reference voltage input to the negative input terminal, the middle comparator outputs a "low" logic level signal. Here, $(2^{n-1}-1)$ comparators, which receive a reference voltage higher than the reference voltage of the middle comparator and output an upper half thermometer code value, all output an upper half thermometer code having a "low" logic level code value.

That is, when the middle comparator outputs the "high" logic level code value since the input analog signal is higher than the reference voltage of the middle comparator, it can be seen from the characteristics of the thermometer code described above that all the lower half thermometer code values are "high" logic level. Therefore, only comparators for receiving a higher reference voltage than the middle comparator and outputting the upper half code value are operated. Also, when the middle comparator outputs the "low" logic level code value since the input analog signal is lower than the reference voltage of the middle comparator, it can be seen from the characteristics of the thermometer code described above that all the upper half thermometer code values are "low" logic level. Therefore, only comparators for receiving a lower reference voltage than the middle comparator and outputting the lower half code value are operated.

As a result, the number of comparators which actually operate can be reduced to about half by using the code value output by the middle comparator as a control signal. That is, the prior art requires $(2^n-1)$ comparators to realize the n-bit flash analog-to-digital converter. However, in one embodiment, the present invention can realize the n-bit analog-to-digital converter by using only $2^{n-1}$ comparators, based on the characteristics of the thermometer code.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1:
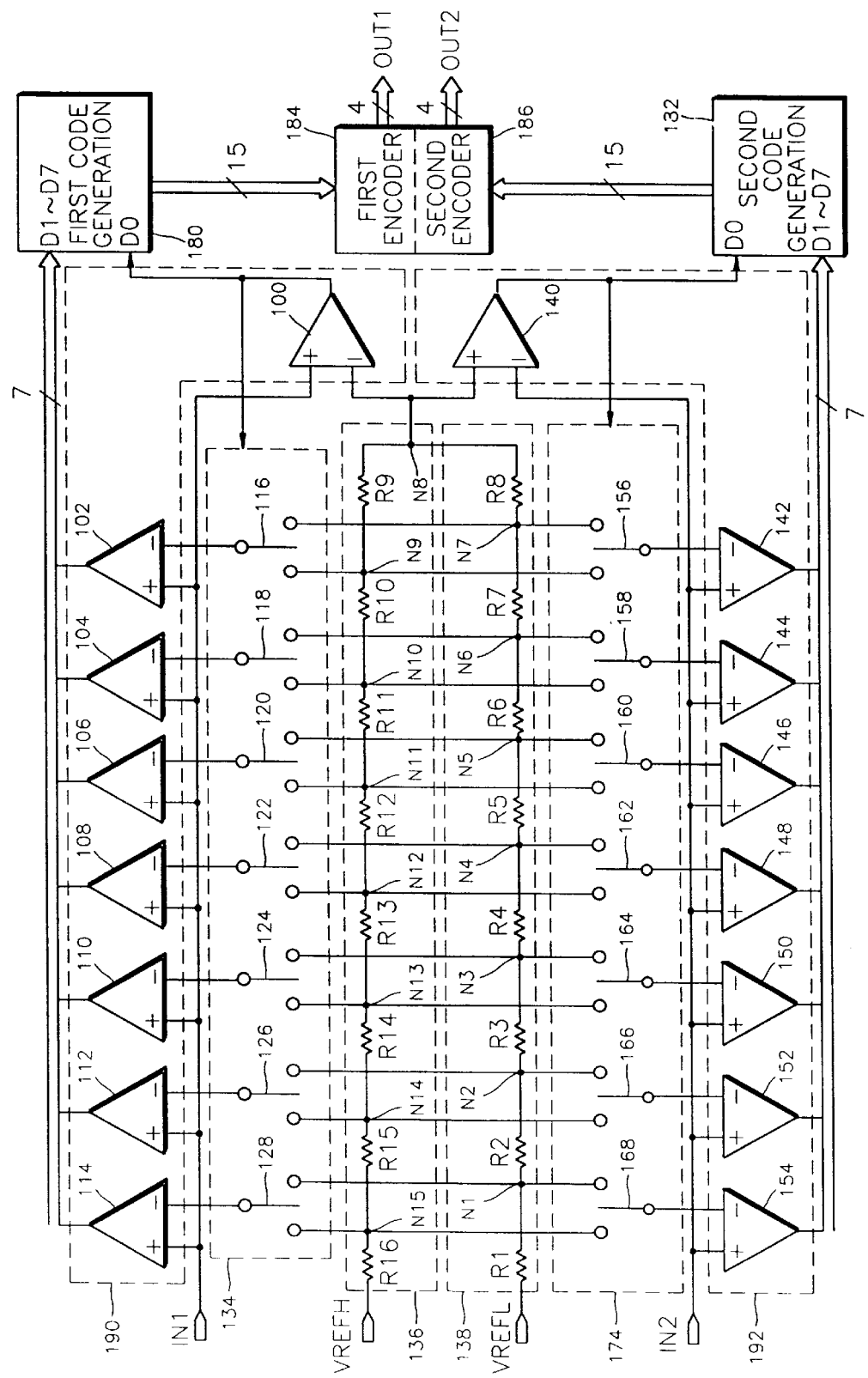
FIG. 1 is a block diagram of one preferred embodiment of a 2-channel flash analog-to-digital converter according to the present invention.

Referring to FIG. 1, a 4-bit 2-channel flash analog-to-digital converter according to the present invention includes a first channel comparing unit 190 having first through eighth comparators 100 through 114, a second channel comparing unit 192 having ninth through sixteenth comparator 140 through 154, a first reference resistor array 138 having first through eighth resistors R1 through R8 connected in series with each other, a second reference resistor array 136 having ninth through sixteenth resistors R9 through R16 connected in series with each other, a first switching unit 134 having first through seventh switches 116 through 128, a second switching unit 174 having eighth through fourteenth switches 156 through 168, first and second code generators 180 and 182, and first and second encoders 184 and 186.

The first through eighth resistors R1 through R8 of the first reference resistor array 138 are connected in series with each other, alternating with first through seventh nodes N1 through N7 at the junctions therebetween, and connect to a first reference voltage VREFL via the first resistor R1. The ninth through sixteenth resistors R9 through R16 of the second reference resistor array 136 are connected in series with each other, alternating with ninth through fifteenth nodes N9 through N15 at the junctions therebetween, and connect to a second reference voltage VREFH via the sixteenth resistor R16. The first and second resistor arrays 138 and 136 are connected in series with each other at an eighth node N8, and the voltage of the eighth node N8 is input to a negative input terminal of the first comparator 100, as the reference voltage thereof.

The first comparator 100 receives a first analog signal from an input port IN1 via its positive input terminal, and the reference voltage of the eighth node N8 via its negative input terminal. The comparator 100 compares the sizes of the two inputs and outputs the result of the comparison as a middle code value of a full thermometer code to the first code generator 180. The middle code value output by the first comparator 100 controls the first switching unit 134 to switch to either the first resistor array 138, so that the first through seventh switches 116 through 128 are respectively connected to the seventh through first nodes N7 through N1, or to the second resistor array 136, so that the first through seventh switches 116 through 128 are respectively connected to the ninth through fifteenth nodes N9 through N15.

When the first switching unit 134 switches to the first resistor array 138 in response to the middle code value output by the first comparator 100, voltages of the seventh through first nodes N7 through N1 are applied respectively to the negative input terminals of the second through eighth comparators 102 through 114. On the other hand, when the first switching unit 134 switches to the second resistor array 136 in response to the middle code value, the voltages of the ninth through fifteenth nodes N9 through N15 are applied respectively to the negative input terminals of the second through eighth comparators 142 through 154.

The second through eighth comparators 102 through 114 receive the reference voltages output respectively from the first through seventh switches 116 through 128 via their negative input terminals and the first analog signal input from the input port IN1 via their positive input terminals. Each compares its two inputs and outputs the result of the comparison as a half thermometer code to the first code generator 180. The first code generator 180 receives the middle code value from the first comparator 100 and a 7-bit half thermometer code whose bits are output by the second through eighth comparators 102 through 114. The first code generator 180 performs a logic operation on the received data and outputs the result of the logic operation as a 15-bit fill thermometer code. The first encoder 184 receives the 15-bit full thermometer code from the first code generator 180 and outputs 4-bit digital data corresponding to the 15-bit full thermometer code to an output port OUT1.

The configurations of the second channel comparing unit 192, the second switching unit 174, the second code generator 182 and the second encoder 186 are analogous to the first channel comparing unit 190, the first switching unit 134, the first code generator 180 and the first encoder 184, respectively.

Figure 2A:
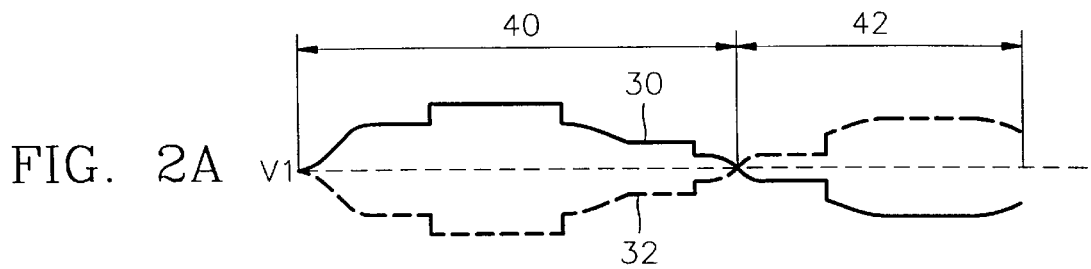
FIGS. 2A through 2G are input/output waveforms of units such as the unit shown in FIG. 1.
Figure 2B:
Figure 2C:
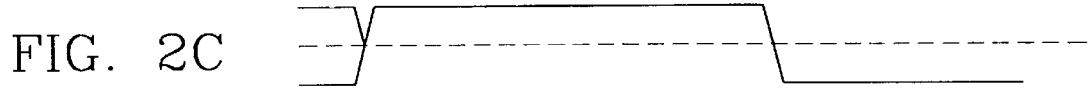
Figure 2D:
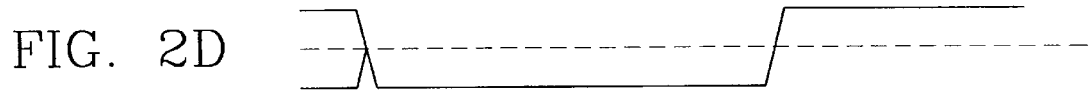
Figure 2E:
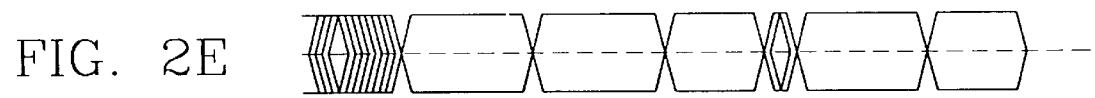
Figure 2F:
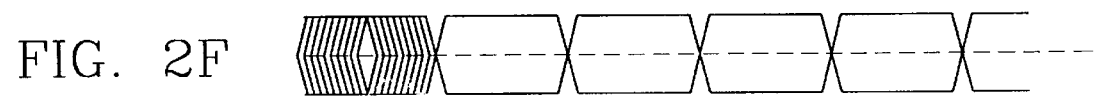
Figure 2G:
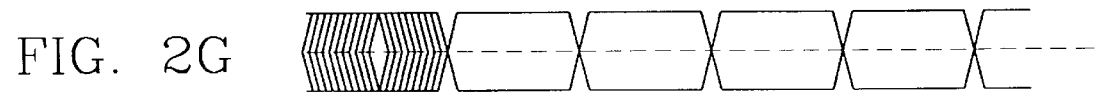

The operation of the device shown in FIG. 1 will now be described. FIGS. 2A through 2G are input/output waveforms of the units shown in FIG. 1. Here, FIG. 2A shows sampled and held analog signals 30 and 32 input from the input ports IN1 and IN2. FIG. 2B shows a system clock signal CK for operating the device shown in FIG. 1. FIG. 2C shows an output signal of the first comparator 100 in the first channel comparing unit 190. FIG. 2D shows an output signal of the ninth comparator 140 in the second channel comparing unit 192. FIG. 2E shows a 7-bit half thermometer code applied to the first and second code generators 180 and 182. FIG. 2F shows a 15-bit full thermometer code output by the first and second code generators 180 and 182. FIG. 2G shows 4-bit digital data output by the first and second encoders 184 and 186.

In the 4-bit 2-channel flash analog-to-digital converter shown in FIG. 1, the first comparator 100 of the first channel comparing unit 190 generates a middle code value of a first channel. The first comparator 100 receives the first analog signal 30 shown in FIG. 2A from the input port IN1 via its positive input terminal and a middle reference voltage V1 from the eighth node N8 via its negative input terminal. Here, the middle reference voltage V1 of the eighth node N8 can be expressed by the following Equation 1.

$$V1=(VREFH-VREFL)/2+VREFL \qquad (1)$$

wherein VREFL and VREFH are first and second reference voltages, respectively. The second reference voltage VREFH is greater than the first reference voltage VREFL. The first through sixteenth resistors R1 through R16 constituting the first and second reference resistor arrays 138 and 136 all have identical resistance. Then, the voltages of the ninth through fifteenth nodes N9 through N15 are higher than the middle reference voltage V1 of the eighth node N8, and the voltages of the first through seventh nodes N1 through N7 are lower than the middle reference voltage V1.

The ninth comparator 140 of the second channel comparing unit 192 generates a middle code value of a second channel. The ninth comparator 140 receives the second analog signal 32 shown in FIG. 2A from the input port IN2 via its negative input terminal and a middle reference voltage V1 from the eighth node N8 via its positive input terminal.

First, the operation of the device of FIG. 1 in a first section 40 of FIG. 2A will be described. In the first section 40, the first analog signal 30 from the input port IN1 is higher than the middle reference voltage V1 and the second analog signal 32 from the input port IN2 is lower than the middle reference voltage V1, in response to the system clock signal.

When the analog signal higher than the middle reference voltage V1 is applied to the first comparator 100 of the first channel comparator 190, the first comparator 100 outputs a middle code value of a "high" logic level as shown in the waveform of FIG. 2C. The "high" logic level middle code value from the first comparator 100 is applied to the first code generator 180 and is simultaneously used as a control signal for controlling the switching of the first switching unit 134.

Meanwhile, when the first comparator 100 outputs the "high" logic level code value, it can be seen from the characteristics of the thermometer code that lower half thermometer code values are all "high" logic level. Accordingly, when the first comparator 100 outputs the high logic level code value, the first through seventh switches 116 through 128 are switched respectively to the ninth through fifteenth nodes N9 through N15 of the second reference resistor array 136 so that the second through eighth comparators 102 through 114 can each output an upper half thermometer code value. When the first through seventh switches 116 through 128 are respectively switched to the ninth through fifteenth nodes N9 through N15 as described above, a voltage higher than the middle reference voltage V1 is applied to the negative input terminal of each of the second through eighth comparators 102 through 114. Each of the second through eighth comparators 102 through 114 compares the voltage input via its negative input terminal with the first analog signal 30 input via its positive input terminal and outputs the result of the comparison as the upper half thermometer code value to the first code generator 180.

For example, assume that the first analog signal 30 from the input port IN1 is higher than the voltage applied to the negative input terminal of the sixth comparator 110 and lower than the voltage applied to the negative input terminal of the seventh comparator 112. Then, all of the second through sixth comparators 102 through 110 output a "high" logic level code value to the first code generator 180, and both the seventh and eighth comparators 112 and 114 output the "low" logic level code value to the first code generator 180.

Meanwhile, when the analog signal higher than the middle reference voltage V1 is applied to the ninth comparator 140 of the second channel comparator 192, the ninth comparator 140 outputs a middle code value of a "low" logic level as shown in the waveform of FIG. 2D. The "low" logic level middle code value from the ninth comparator 140 is applied to the second code generator 182, and is simultaneously used as a control signal to control the switching of the second switching unit 174. As described above, when the ninth comparator 140 outputs the "low" logic level code value, it can be seen from the characteristics of the thermometer code that the upper half thermometer code values are all "low" logic level.

Accordingly, when the ninth comparator 140 outputs the low logic level code value, the eighth through fourteenth switches 156 through 168 are switched respectively to the seventh through first nodes N7 through N1 of the first reference resistor array 138 so that the tenth through sixteenth comparators 142 through 154 can each output a lower half thermometer code value. When the eighth through fourteenth switches 156 through 168 are respectively switched to the seventh through first nodes N7 through N1 as described above, a voltage lower than the middle reference voltage V1 is applied to the negative input terminal of each of the tenth through sixteenth comparators 142 through 154. Each of the tenth through sixteenth comparators 142 through 154 compares the voltage input via its negative input terminal with the second analog signal 32 input via its positive input terminal and outputs the result of the comparison as a lower half thermometer code value to the second code generator 182.

For example, assume that the second analog signal 32 from the input port IN2 is lower than the voltage applied to the negative input terminal of the fourteenth comparator 150 and higher than the voltage applied to the negative input terminal of the fifteenth comparator 152. Then, all of the tenth through fourteenth comparators 142 through 150 output a "low" logic level code value to the second code generator 182, and both the fifteenth and sixteenth comparators 152 and 154 output a "high" logic level code value to the second code generator 182.

Now, the operation of the device of FIG. 1 in a second section 42 of FIG. 2A will be described. In the first section 40, the first analog signal 30 from the input port IN1 is lower than the middle reference voltage V1 and the second analog signal 32 from the input port IN2 is higher than the middle reference voltage V1, in response to the system clock signal.

When the analog signal lower than the middle reference voltage V1 is applied to the first comparator 100 of the first channel comparator 190, the first comparator 100 outputs a middle code value of a "low" logic level as shown in the waveform of FIG. 2C. The "low" logic level middle code value from the first comparator 100 is applied to the first code generator 180 and is simultaneously used as a control signal to control the switching of the first switching unit 134. That is, when the first comparator 100 outputs the low logic level code value, the first through seventh switches 116 through 128 are switched respectively to the seventh through first nodes N7 through N1 of the first reference resistor array 138, so that the second through eighth comparators 102 through 114 can each output a lower half thermometer code value.

When the first through seventh switches 116 through 128 are respectively switched to the seventh through first nodes N7 through N1 as described above, a voltage lower than the middle reference voltage V1 is applied to the negative input terminal of each of the second through eighth comparators 102 through 114. Each of the second through eighth comparators 102 through 114 compares the voltage input via its negative input terminal with the first analog signal 30 input via its positive input terminal and outputs the result of the comparison as the lower half thermometer code value to the first code generator 180.

For example, assume that the first analog signal 30 from the input port IN1 is lower than the voltage applied to the negative input terminal of the sixth comparator 110 and higher than the voltage applied to the negative input terminal of the seventh comparator 112. Then, all of the second through sixth comparators 102 through 110 output a "low" logic level code value to the first code generator 180, and both the seventh and eighth comparators 112 and 114 output a "high" logic level code value to the first code generator 180.

Meanwhile, when the analog signal higher than the middle reference voltage V1 is applied to the ninth comparator 140 of the second channel comparator 192, the ninth comparator 140 outputs a middle code value of a "high"

logic level as shown in the waveform of FIG. 2D. The "high" logic level middle code value from the ninth comparator 140 is applied to the second code generator 182, and is simultaneously used as a control signal for controlling the switching of the second switching unit 174. That is, when the ninth comparator 140 outputs a logic level code value, the eighth through fourteenth switches 156 through 168 are switched respectively to the ninth through fifteenth nodes N9 through N15 of the second reference resistor array 136 so that the tenth through sixteenth comparators 142 through 154 can each output an upper half thermometer code value.

When the eighth through fourteenth switches 156 through 168 are respectively switched to the ninth through fifteenth nodes N9 through N15 as described above, a voltage higher than the middle reference voltage V1 is applied to the negative input terminal of each of the tenth through sixteenth comparators 142 through 154. Each of the tenth through sixteenth comparators 142 through 154 compares the voltage input via its negative input terminal with the second analog signal 32 input via its positive input terminal and outputs the result of the comparison as the upper half thermometer code value to the second code generator 182.

For example, assume that the second analog signal 32 from the input port IN2 is higher than the voltage applied to the negative input terminal of the fourteenth comparator 150 and lower than the voltage applied to the negative input terminal of the fifteenth comparator 152. Then, all of the tenth through fourteenth comparators 142 through 150 output a "high" logic level code value to the second code generator 182, and both the fifteenth and sixteenth comparators 152 and 154 output a "low" logic level code value to the second code generator 182.

According to the operation described above, the first channel comparing unit 190 outputs the middle code value of a first channel and the 7-bit first-channel half thermometer code value shown in FIG. 2E to the first code generator 180. The second channel comparing unit 192 outputs the middle code value of a second channel and the 7-bit second-channel half thermometer code value shown in FIG. 2E to the second code generator 182. The first and second code generators 180 and 182 perform logical combinations on the middle code values and 7-bit half thermometer code values received from the first and second channel comparing units 190 and 192, convert the results into 15-bit full thermometer code values shown in FIG. 2F, and output the 15-bit full thermometer code values to the first and second encoders 184 and 186, respectively.

The first and second encoders 184 and 186 receive the 15-bit full thermometer code values from the first and second code generators 180 and 182, encode the same into binary data corresponding to the thermometer code values, and output the 4-bit binary data shown in FIG. 2G to the output ports OUT1 and OUT2, respectively.

Consequently, when $2^4$ comparators are used, a 4-bit 2-channel flash analog-to-digital converter can be realized in the present invention while just a 4-bit single channel flash analog-to-digital converter can be realized in prior devices. Meanwhile, even though the same reference resistor array is shared by the first and second channels in the converter of FIG. 1, a single reference resistor array may be shared by two or more channels in a multi-channel analog-to-digital converter in an alternative embodiment of the present invention. Since the number of comparators is reduced to half of that in prior devices in case of a single channel converter and the number comparators and resistors are further reduced for a multi-channel converter because the same reference resistor array is used for all the channels, mismatching between comparators and between channels caused by process variations can be significantly reduced compared to the prior devices.

Figure 3:
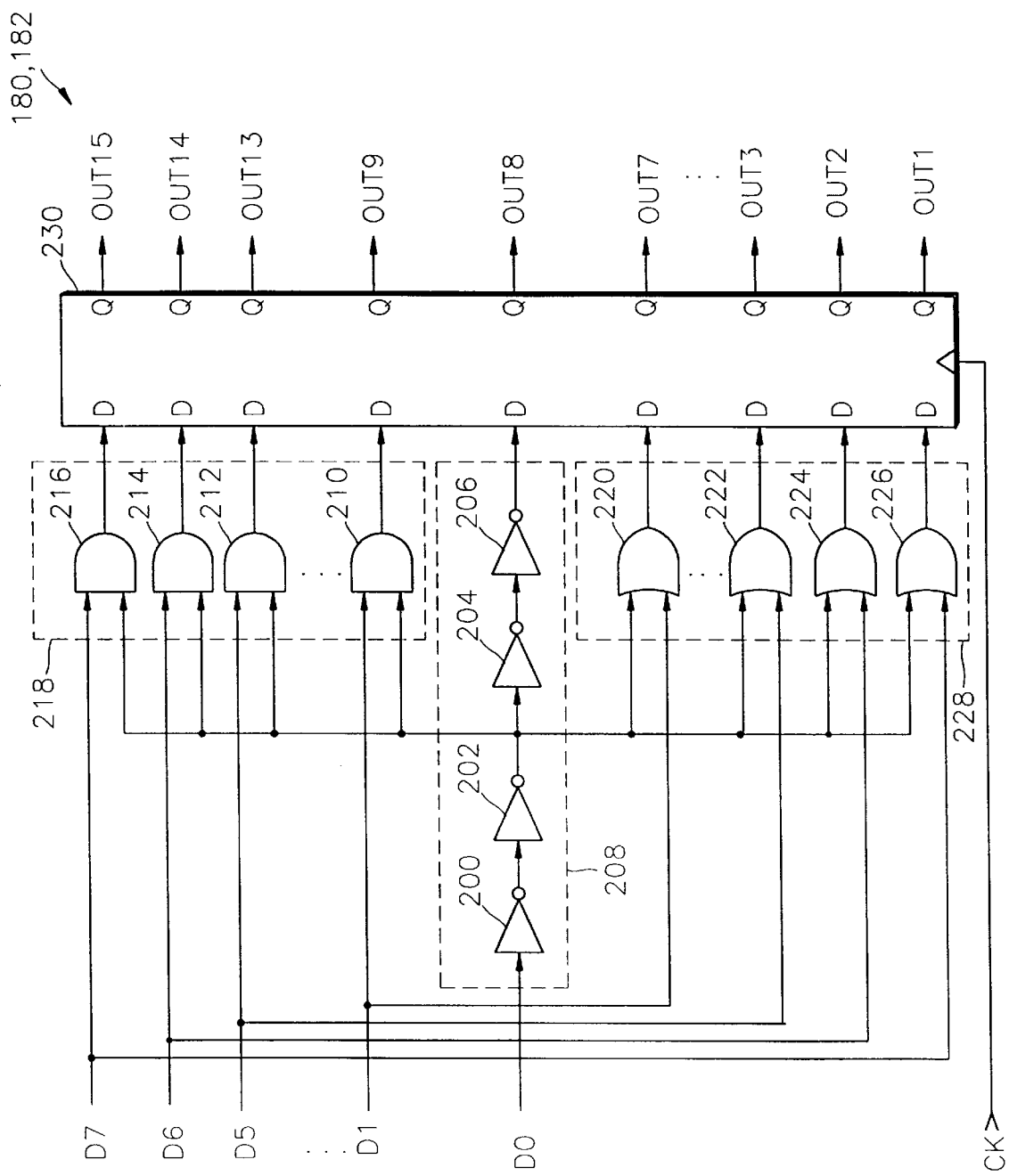
FIG. 3 is a circuit diagram of first and second code generators shown in FIG. 1.

FIG. 3 is a circuit diagram of a preferred embodiment of the first and second code generators 180 and 182 shown in FIG. 1 according to the present invention. In FIG. 3, the code generator includes an inverting unit 208 comprised of first through fourth invertors 200 through 206, a first logic combination unit 218 comprised of first through (m/2−1)th AND gates 210 through 216, a second logic combination unit 228 comprised of first through (m/2−1)th OR gates 220 through 226, and a latch unit 230. The code generator shown in FIG. 3 performs a logic operation on the middle code value and the 7-bit half thermometer code output by the first or second channel comparator 190 or 192 of FIG. 1, and converts the result to a 15-bit full thermometer code.

In FIG. 3, D0 indicates a middle code value output by the first or second channel comparator 190 or 192, and D1 through D7 constitute a half thermometer code output by the first or second channel comparator 190 or 192. The first logic combination unit 218 performs a logic operation on the half thermometer code values D1 through D7 and the middle code value D0 and generates an upper half thermometer code. The second logic combination unit 228 performs a logic operation on the half thermometer code values D1 through D7 and the middle code value D0 and generates a lower half thermometer code. Here, the first through fourth invertors 200 through 206 are used to increase a fan-out of the middle code value D0.

The latch unit 230 receives the 7-bit upper half thermometer code generated by the first logic combination unit 218, the middle code value, and the 7-bit lower half thermometer code generated by the second logic combination unit 228 in response to a system clock signal CK, and outputs the received codes as a 15-bit full thermometer code.

The operation of the code generator shown in FIG. 3 will now be described referring to the first channel comparator 190 shown in FIG. 1. First, if an analog signal larger than the middle reference voltage V1 is input to the input port IN1, the first comparator 100 outputs the middle code value of a "high" logic level. At this time, the OR gates in the second logic combination unit 228 each receive the "high" logic level middle code value D0 and output a "high" logic level code value. Thus, the second logic combination unit 228 outputs a 7-bit lower half thermometer code of a "high" logic level. The first logic combination unit 218 receives the "high" logic level middle code value D0 and code values from the first channel comparing unit 190, and outputs a 7-bit upper half thermometer code.

For example, it is assumed that the analog signal input from the input port IN1 is greater than the voltage input to a negative input terminal of the sixth comparator 110 and smaller than the voltage input to a negative input terminal of the seventh comparator 112. Then, the seventh and eighth comparators 112 and 114 output "low" logic level codes D6 and D7, and the second through sixth comparators 102 through 110 output "high" logic level codes D1 through D5. Thus, the sixth and seventh AND gates 214 and 216 receive the "low" logic level code values and output the same to the latch unit 230, and the first through fifth AND gates 210 through 212 receive the "high" logic level codes and output the same to the latch unit 230.

The latch unit 230 latches the code values output by the first and second logic combination units 218 and 228 and the inverting unit 208 in response to the system clock signal CK. The latch unit 230 outputs "high" logic level code values to output ports OUT1 through OUT13 and "low" logic level code values to output ports OUT14 and OUT15, thus outputting a 15-bit full thermometer code.

If an analog signal smaller than the middle reference voltage V1 is input to the input port IN1, the first comparator 100 outputs the middle code value of a "low" logic level. At this time, the AND gates in the first logic combination unit 218 which receive the "low" logic level middle code value D0 all output a "low" logic level code value. Thus, the first logic combination unit 218 outputs a 7-bit upper half thermometer code of "low" logic level. The second logic combination unit 228 receives the "low" logic level middle code value D0 and code values from the first channel comparing unit 190 and outputs a 7-bit lower half thermometer code.

For example, it is assumed that the analog signal input from the input port IN1 is smaller than the voltage input to a negative input terminal of the sixth comparator 110 and greater than the voltage input to a negative input terminal of the seventh comparator 112. Then, the second through sixth comparators 102 through 110 output "low" logic level codes D1 through D5, and the seventh and eighth comparators 112 and 114 output "high" logic level codes D6 and D7. Thus, the first through fifth OR gates 220 through 222 receive the "low" logic level code values and output the same to the latch unit 230, and the sixth and seventh OR gates 224 and 226 receive the "high" logic level codes and output the same to the latch unit 230.

The latch unit 230 latches the code values output by the first and second logic combination units 218 and 228 and the inverting unit 208 in response to the system clock signal CK. The latch unit 230 outputs "high" logic level code values to output ports OUT1 and OUT2 and "low" logic level code values to output ports OUT3 through OUT15, thus outputting a 15-bit full thermometer code.

The operation of the second code generator 182 corresponding to the output code value of the second channel comparing unit 192 is analogous to that of the first code generator 180 corresponding to the output code value of the first channel comparing unit 190, and so will not be described again.

As described above, the flash analog-to-digital converter according to the present invention can reduce the number of comparators almost to half of that in the prior art. Also, in an analog-to-digital converter having two channels or more, all channels share the same reference resistor array. Accordingly, power consumption and chip size can be reduced, and mismatching between comparators and between channels, caused by process variations in the manufacture of the comparators and reference resistors, can also be reduced. Furthermore, as the number of comparators is reduced and the effect of the process variation is diminished, a converter having many bits can be manufactured.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An n-bit flash analog-to-digital converter for receiving an analog signal and generating an n-bit binary data in response thereto, said flash analog-to-digital converter comprising:

a half code generator for receiving the analog signal and outputting a one-bit middle code and a (m/2−1)-bit half thermometer code in response to a system clock signal, wherein m=$2^n$ and n is a positive integer;

a code generator for receiving the middle code and the (m/2−1)-bit half thermometer code, performing a logic operation with respect to the middle code and the half thermometer code, and outputting an operation result as a (m−1)-bit full thermometer code; and an encoder for encoding the (m−1)-bit full thermometer code into the n-bit binary data.

2. The flash analog-to-digital converter as claimed in claim 1, wherein said half thermometer code generator comprises:

a first reference resistor array having (m/2) resistors of equal resistance which are connected in series with each other between a first reference voltage and a first node;

a second reference resistor array having (m/2) resistors of equal resistance which are connected in series with each other between said first node and a second reference voltage;

an intermediate comparator for receiving the analog signal via a positive input terminal in response to the system clock signal and a middle reference voltage from said first node via a negative input terminal, comparing the analog signal with the middle reference voltage, and outputting a comparison result as the middle code;

first through (m/2−1)th switches for selecting a voltage at a respective node of said first reference resistor array or a voltage at a respective node of said second reference resistor array in response to the middle code, and outputting a selected voltage as a respective reference voltage; and first through (m/2−1)th comparators for receiving the analog signal via a respective positive input terminal and the reference voltage of from a respective one of said first through (m/2−1)th switches via a respective negative input terminal in response to the system clock signal, comparing the analog signal with the reference voltage, and outputting a respective comparison result as a corresponding bit of the (m/2−1)-bit half thermometer code.

3. The flash analog-to-digital converter as claimed in claim 1, wherein said code generator comprises:

a first logic combination unit for performing a logic combination on the middle code and each bit of the (m/2−1)-bit half thermometer code, and outputting a combination result as a (m/2−1)-bit upper half thermometer code;

a second logic combination unit for performing a logic combination on the middle code and each bit of the (m/2−1)-bit half thermometer code, and outputting a combination result as a (m/2−1)-bit lower half thermometer code; and a latch for latching the (m/2−1)-bit lower and upper half thermometer codes and the middle code in response to the system clock signal, and outputting latched codes as the (m−1)-bit full thermometer code.

4. The flash analog-to-digital converter as claimed in claim 3, wherein said first logic combination unit comprises first through (m/2−1)th AND gates for performing AND operations on each bit of the (m/2−1)-bit half thermometer code and the middle code, and outputting a result of the AND operations as the (m/2−1)-bit upper half thermometer code.

5. The flash analog-to-digital converter as claimed in claim 3, wherein said second logic combination unit comprises first through (m/2−1)th OR gates for performing OR operations on each bit of the (m/2−1)-bit half thermometer code and the middle code, and outputting a result of OR operations as the (m/2−1)-bit lower half thermometer code.

6. An n-bit flash analog-to-digital converter for generating n-bit binary data in response to received analog signals, said flash analog-to-digital converter comprising:

- a half thermometer code generator for receiving first through p-th analog signals via first through p-th input terminals, respectively, and outputting a one-bit middle code and a (m/2−1)-bit half thermometer code, where m=$2^n$ and n is a positive integer, for each of the first through p-th analog signals in response to a system clock signal, wherein p is an integer greater than 1;
- first through p-th channel respective code generators for receiving the middle code and the (m/2−1)-bit half thermometer code, performing a logic operation with respect to the middle code and the half thermometer code, and outputting an operation result as a (m−1)-bit full thermometer code;
- an encoder for encoding the (m−1)-bit full thermometer code into an n-bit binary data; and
- first through p-th respective channel encoders for encoding the (m−1)-bit full thermometer code output by respective one of said first through p-th channel code generators into n-bit binary data.

7. The flash analog-to-digital converter as claimed in claim 6, wherein said half thermometer code generator comprises:

- a first reference resistor array having (m/2) resistors of equal resistance which are connected in series with each other, between a first reference voltage and a first node;
- a second reference resistor array having (m/2) resistors of equal resistance which are connected in series with each other between said first node and a second reference voltage;
- first through p-th channel intermediate comparators each for receiving corresponding one of the first through p-th analog signals via a positive input terminal in response to the system clock signal and a middle reference voltage from said first node via a negative input terminal, comparing the corresponding one of the first through p-th analog signals with the middle reference voltage, and outputting a comparison result as a corresponding one of the first through p-th channel middle codes;
- first through p-th channel switching units each having first through (m/2−1)th switches for selecting a voltage at a respective node of said first reference resistor array or a voltage at a respective node of said second reference resistor array in response to the middle code, and outputting a selected voltage as a respective reference voltage of the corresponding one of the first through p-th channels; and
- first through p-th channel comparing units each having first through (m/2−1)th comparators for receiving the analog signal of corresponding channel via a respective positive input terminal and the reference voltage of from a respective one of said first through (m/2−1)th switches via a respective negative input terminal in response to the system clock signal, comparing the analog signal with the reference voltage, and outputting a respective comparison result as a corresponding bit of the (m/2−1)-bit half thermometer code.

8. The flash analog-to-digital converter as claimed in claim 6, wherein each of said first through p-th channel code generators comprises:

- a first logic combination unit for performing a logic combination on the middle code and each bit of the (m/2−1)-bit half thermometer code, and outputting a combination result as a (m/2−1)-bit upper half thermometer code of a corresponding channel;
- a second logic combination unit for performing a logic combination on the middle code and each bit of the (m/2−1)-bit half thermometer code, and outputting a combination result as a (m/2−1)-bit lower half thermometer code of the corresponding channel; and
- a latch for latching the (m/2−1)-bit lower and upper half thermometer codes of the corresponding channel and the middle code in response to the system clock signal, and outputting latched codes as the (m−1)-bit full thermometer code of the corresponding channel.

9. The flash analog-to-digital converter as claimed in claim 8, wherein said first logic combination unit comprises first through (m/2−1)th AND gates for performing AND operations on each bit of the (m/2−1)-bit half thermometer code and the middle code, and outputting a result of the AND operations as the (m/2−1)-bit upper half thermometer code.

10. The flash analog-to-digital converter as claimed in claim 8, wherein said second logic combination unit comprises first through (m/2−1)th OR gates for performing OR operations on each bit of the (m/2−1)-bit half thermometer code and the middle code, and outputting a result of OR operations as the (m/2−1)-bit lower half thermometer code.

* * * * *